United States Patent
Lai

[19]

[11] Patent Number: 5,872,488
[45] Date of Patent: Feb. 16, 1999

[54] DUAL INPUT VOLTAGE CONTROLLED OSCILLATOR WITH COMPENSATED BANG/BANG FREQUENCY

[75] Inventor: Benny W H Lai, Frement, Calif.

[73] Assignee: Hewlett-Packard Company, Palo Alto, Calif.

[21] Appl. No.: 749,596

[22] Filed: Nov. 15, 1996

[51] Int. Cl.$^6$ .............................. H03B 5/24; H03B 5/04; H03L 1/00; H03L 7/099
[52] U.S. Cl. .............................. 331/57; 331/34; 331/175; 331/177 R; 375/376
[58] Field of Search .................................. 331/1 A, 8, 17, 331/34, 57, 116 FE, 175, 177 R; 375/376

[56] References Cited

U.S. PATENT DOCUMENTS 5,012,494   4/1991   Lai et al. .............................. 331/17 X
5,673,008   9/1997   Sumita ....................................... 331/57

OTHER PUBLICATIONS

Digital Line Systems Based on the Synchronous Digital Hierarchy for Use on Optical Fibre Cables, CCITT Recommendation G.958, Geneva 1990, pp. 15–17.

"A Monolithic 622 Mb/s Clock Extraction Data Retiming Circuit", Benny Lai and Richard Walker, 1991 ISSCC Proceedings, TPM 8.7, pp. 144–145.

"A 2–Chip 1.5 Gb/s Bus–Oriented Serial Link Interface", 1992 ISSCC Proceedings, FA 14.4, pp. 226–227, Walker et al.

"G–Link: A Chipset for Gigabit–Rate Data Communication", Hewlett–Packard Journal, vol. 43, No. 5, Oct. 1992, pp. 103–116, Yen et al.

*Primary Examiner*—David Mis
*Attorney, Agent, or Firm*—Jonathan B. Penn

[57] ABSTRACT

A dual input voltage controlled oscillator ("VCO") suitable for use in clock and data recovery ("CDR") systems operating at 100s to 1,000s of MB/sec is described. When a PLL using this VCO is locked onto a data stream of a fixed bit rate, the bang/bang frequency of the VCO does not vary due to process and temperature variation occuring either during manufacture or operation. The VCO is also relatively insensitive to supply voltage variations.

5 Claims, 3 Drawing Sheets

DUAL INPUT VOLTAGE CONTROLLED OSCILLATOR WITH COMPENSATED BANG/BANG FREQUENCY

BACKGROUND OF THE INVENTION

In modern digital communications systems, the receiver must have a clock and data recovery ("CDR") system to decode and decipher data. Two standards for data transmission at bit rates ranging from 100s of MB/sec to more than 1 GB/sec make particular demands on the CDR system. These standards are SONET/SDH at 155 and 622 MB/sec and Fibre-Channel at 531.25 and 1062.5 MB/sec.

Earlier CDR systems have been implemented with surface acoustic wave("SAW") technology, which is difficult to use in integrated circuits("IC"s) and the resultant CDRs are therefore expensive. Recently, phase lock loop("PLL") designs have substantially reduced the cost of CDR systems. All PLL systems have a phase detector, some type of loop filter, and a voltage controlled oscillator("VCO").

For SONET/SDH data transmission environments, strict specifications are imposed on the CDR system in terms of jitter performance, including specified levels of jitter transfer, jitter tolerance, and jitter generation. These terms are defined in The International Telegraph and Telephone Consultative Committee Recommendation G.958, "Digital Line Systems Based On The Synchronous Digital Hierarchy For Use On Optical Fibre Cables", incorporated herein for all purposes. With jitter transfer and jitter tolerance, the corner frequencies of phase modulation at the input of the CDR system are defined, and are directly related to the behavior of the PLL.

One known PLL architecture that has been successful in CDR systems operating at bit rates exceeding 1 GB/sec uses a special VCO. This architecture combines part of the loop filter function with the VCO by feeding the phase detector output directly into a "bang/bang" input of the VCO. A dual input VCO is therefore required. The first input is the commonly known analog voltage input, upon which analog voltage the VCO output frequency is monotonically dependent. The second input is a digital signal input. Depending upon a logic high or logic low signal, the VCO's output frequency alternates between two small but distinct "bang/bang"frequencies. This architecture stabilizes the overall PLL, provided that the phase change due to the bang/bang frequency loop is larger than the phase change introduced by the loop filter.

In one known dual input VCO CDR system, the VCO is realized as a ring oscillator consisting of three variable delay cells and a bang/bang modulation delay cell. The variable delay cell interpolates between two paths, each path having a different delay. The bang/bang delay is achieved by modulating the bias current of an inverting gain stage biased below the peak $f_T$ current.

This first known design has been improved by embedding the bang/bang control within the variable delay cell, which provides the VCO with a larger frequency range.

In both known designs, the bang/bang delay is dependent on the inherent delays of inverters. This makes the bang/bang frequency sensitive to the process, temperature, and supply voltage variations inherent in the fabrication and operation of inverters. In known application, the bang/bang frequency is simply designed large enough to provide loop stability with ample margin.

Unfortunately, these two approaches do not give enough control over the bang/bang frequency to comply with strict SONET/SDH jitter requirements. The dual loop PLL CDR system can be adapted to meet the SONET/SDH jitter requirements provided that the bang/bang frequency of the VCO can be set with precision and then remain constant over temperature and supply voltage variations. The bang/bang frequency directly determines the jitter transfer and jitter tolerance corner frequencies and must be set to meet the corresponding SONET/SDH requirements.

SUMMARY OF THE INVENTION

The first preferred embodiment of the present invention is a dual input VCO with sufficiently precise control over the bang/bang frequency to meet SONET/SDH jitter requirements. The VCO comprises a plurality of variable delay cells and bang/bang modulation circuits. A first input to the VCO is an analog voltage signal which monotonically adjusts the VCO output frequency. The VCO's output frequency is called herein the operating frequency. A second input is a digital bang/bang signal which modulates the VCO's operating frequency between two slightly different frequencies. The difference of the periods of the two bang/bang frequencies (bang/bang time) is a fixed fraction of the VCO's operating frequency. When the VCO is used in a PLL, which PLL is locked onto a data stream of a fixed bit rate, the bang/bang time becomes a constant ratio of the bit rate, and is independent of supply voltage, temperature, and process variations.

DETAILED DESCRIPTION OF THE PREFERRED EMBODIMENT

Figure 1:
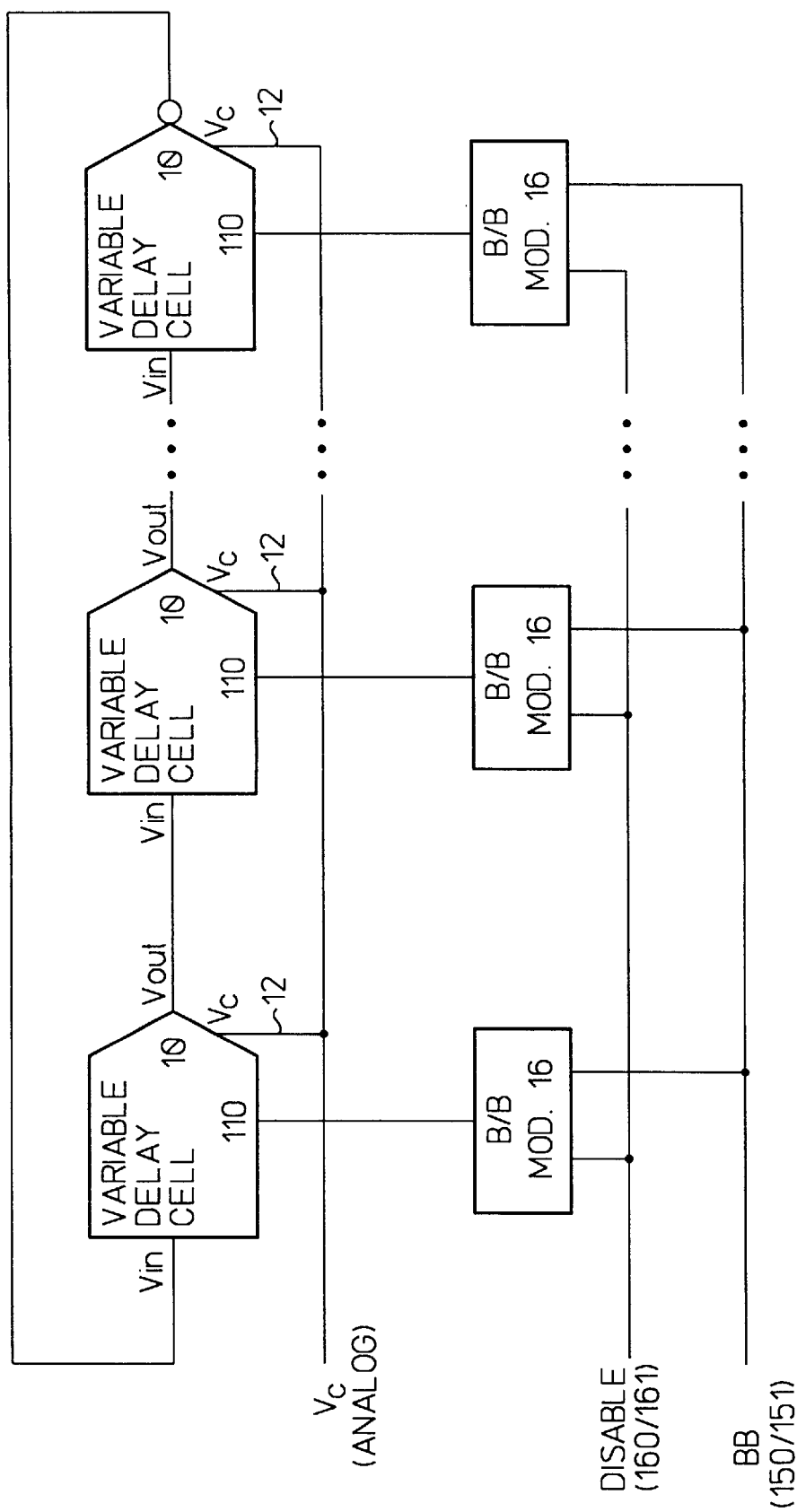
FIG. 1 is a block diagram of a first embodiment of the present invention.

A block diagram of a first embodiment of the present invention is shown in FIG. 1. Dual input VCO 5 comprises N identical variable delay cells 10 connected in a ring oscillator configuration. In the first preferred embodiment, four delay cells 10 are used. Variable delay cells 10 each have an analog differential voltage $V_c$ input 12 and a digital unitary bang/bang modulation input 110. Cells 10 additionally have a differential $V_{in}$ input and a differential $V_{out}$ output. Bang/bang modulation input 110 is provided by bang/bang modulation circuits 16. The signals at the outputs of the cells could be tapped and buffered to provide the VCO outputs with different phases.

Figure 2:
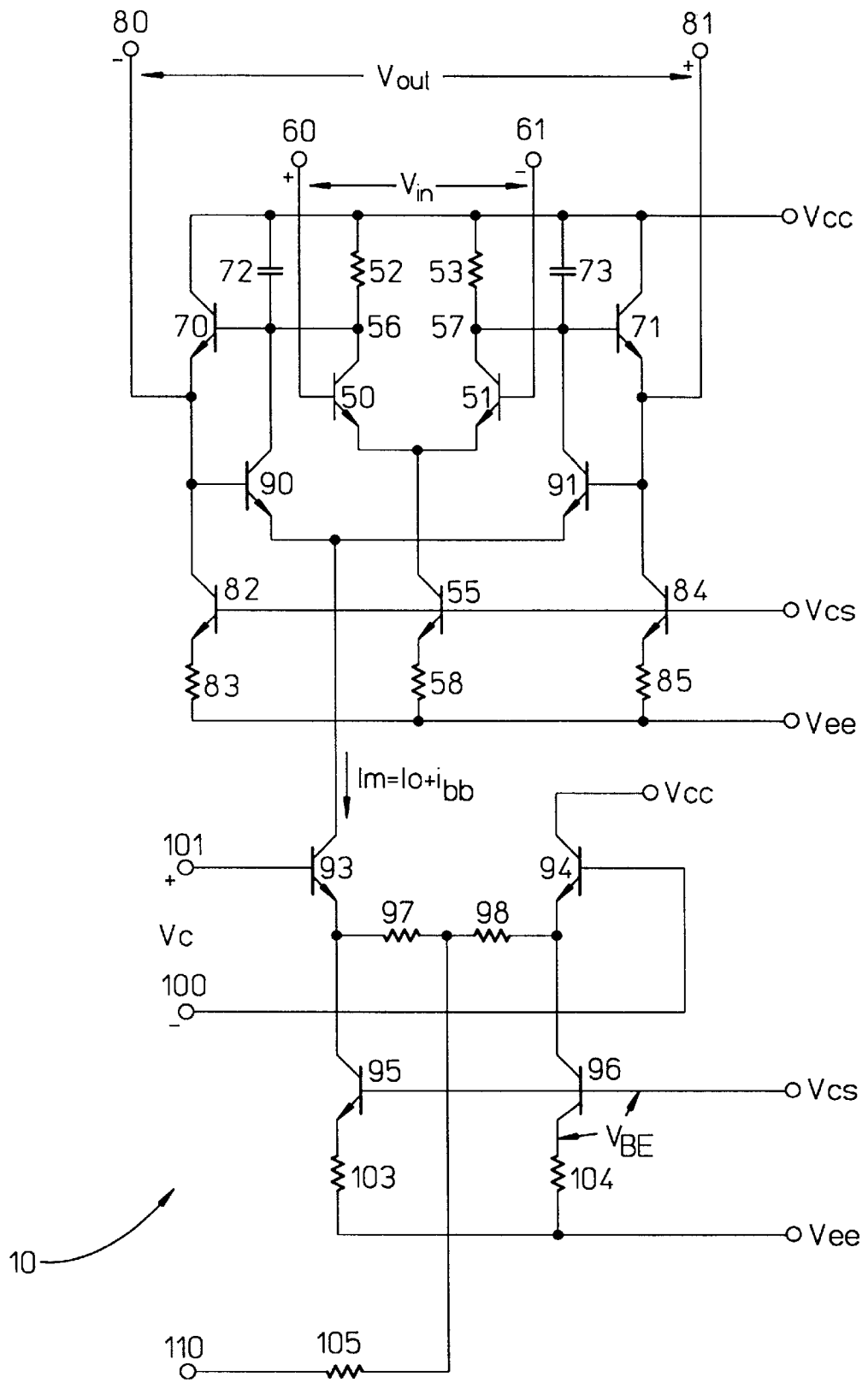
FIG. 2 is a circuit diagram of the variable delay cell shown in FIG. 1.

The delay of each delay cell 10 is determined by its controlling voltage. In this first embodiment, $T_d = T_{do} + kV_c I_m$, where $T_{do}$ is the delay when $V_c = 0$, $V_c$ is a differential analog controlling voltage, k is a factor in sec/(volt-amp), and $I_m$ is the modulation current. As shown in FIG. 2, $I_m$ has two components: $I_m = I_o + i_{bb}$, where $I_o$ is a DC current and $i_{bb}$ is the bang/bang current controlled with a BB digital input 150 and 151(see FIG. 3), with $i_{bb} << I_o$.

As shown in FIG. 1, one period P of the ring oscillator of delay cells 10 consists of two trips around the ring, with $P = 2nT_d = P_o + 2nk \, V_c(I_o + i_{bb})$, where $Po = 2nT_{do}$. $i_{bb}$ is a purposely made a fixed fraction m of $I_o$, or $i_{bb} = \pm mI_o$ so that $P = P_o + 2nkV_c I_o(1 \pm m)$. P can therefore be represented by two components: $P = T_o \pm 0.5 T_{bb}$ where $T_o = P_o + (2nkV_c I_o)$, which is the nominal delay, and $T_{bb} = (4nkV_c I_o)m$, which is the bang/bang time. For $m << 1$, $T_o = P$ and $T_{bb} = mP$.

When a PLL using the VCO described herein is locked onto an incoming data stream with a defined data rate, period P is a constant. Controlling voltage $V_c$ is continuously adjusted by the PLL to achieve and maintain this lock. With this, $T_{bb}$ is defined only by a constant bit rate and the factor m, which is designed to be a ratio of resistors. The bang/bang frequency is simply the frequency corresponding to the difference between the two periods, with $F_{bb}=[1/(T_o+T_{bb}/2)]-[1/(T_o-T_{bb}/2)]$. With $T_{bb}$ thus defined and compensated for, the purpose of the present invention with regard to the stability of $F_{bb}$ is achieved.

FIG. 2 is a circuit diagram of variable delay cell 10. Identical transistors 50 and 51 and identical resistors 52 and 53 form the basic switching element. Inputs 60 and 61, together called $V_{in}$, are fed into the bases of transistors 50 and 51, respectively, and the voltages at the collectors of transistors 50 and 51 are buffered by identical transistors 70 and 71, respectively, to provide outputs 80 and 81, together called $V_{out}$. The emitters of transistors 50 and 51 are driven from a current source provided by the collector of transistor 55 and resistor 58.

Nodes 56 and 57 have identical capacitive loads 72 and 73. Thus, these nodes generate time delays directly related to their voltage swings. $V_{cc}$ and $V_{ee}$ are DC voltages supplied to power delay cell 10 and $V_{cs}$ is a DC voltage supplied to turn on the various current sources. These current sources include transistor 82 and resistor 83 and transistor 84 and resistor 85, which respectively act as current sources for transistors 70 and 71.

The delay modulation is controlled by transistors 90 and 91 and the variable current source provided by transistors 93, 94, 95, and 96 and resistors 97 and 98. Resistors 97 and 98 are identical. Transistors 90 and 91 are configured to retard the switching action of transistors 50 and 51. The controlling current $I_m$ modulates the voltage swings of nodes 56 and 57, thereby controlling the delay.

$V_c$ inputs 100 and 101 feed into the bases of transistors 94 and 93, respectively. These two transistors form a current steering circuit that defines the modulation current $I_m$. The nominal current available to the steering circuit is provided by two current sources comprised of transistor 95 and resistor 103 and transistor 96 and resistor 104. Resistors 103 and 104 are identical. Together these current sources sum up to DC current $I_o$ and a trickle current through resistor 105. This trickle current through resistor 105 is digitally modulated by the bang/bang input 110, which is driven by bang/bang modulation circuit 16, described below. This bang/bang modulation results in a delta current $i_{bb}$ appearing in the trickle current flowing through resistor 105. The DC component of the trickle current is designed to be much less than $I_o$ and can be ignored.

As previously stated, $I_m=I_o+i_{bb}$. This current is steered by $V_c$, the voltage between nodes 100 and 101 which forms the analog differential control input to the VCO, which is applied across transistors 93 and 94, and modulates the delay between $V_{in}$ and $V_{out}$, through the cell. Thus, $T_d=T_{do}+kV_cI_m$, where $T_{do}$ is the delay when $V_c=0$, $V_c$ is the analog controlling voltage, $I_m$ is the modulation current, and k is a factor in sec/(volt-amp), which is a function of the load resistance, capacitance, and process variables.

Figure 3:
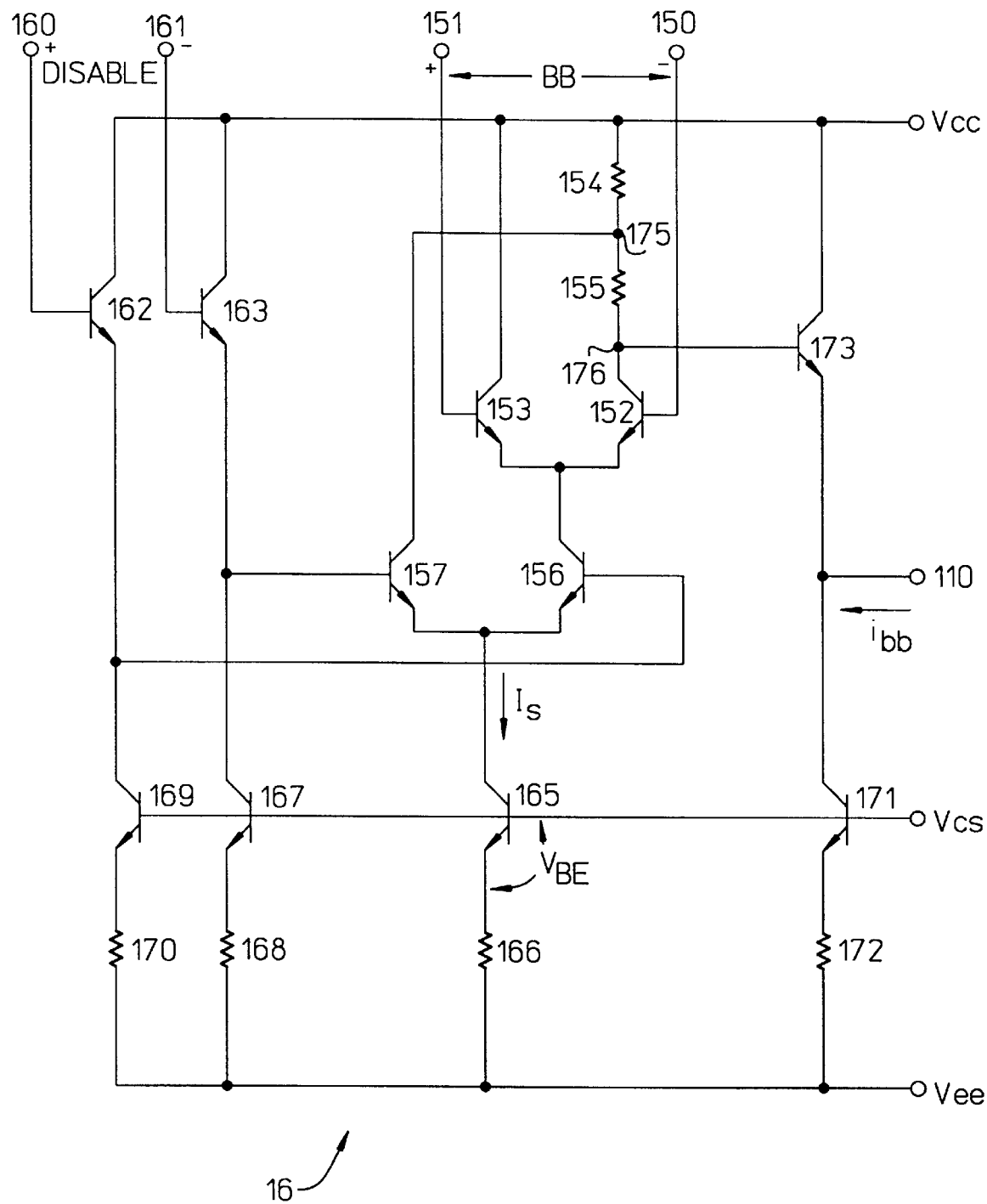
FIG. 3 is a circuit diagram of the bang/bang modulation circuit shown in FIG. 1.

FIG. 3 is a circuit diagram of bang/bang modulation circuit 16. Differential digital inputs 150 and 151 ("BB") are coupled to the bases of transistors 152 and 153, respectively. Load resistors 154 and 155 are coupled from $V_{cc}$ to the collector of transistor 152. The emitters of transistors 153 and 152 are coupled to the collector of transistor 156, which enables the bias current to activate the bang/bang function. When the disable input (160/161) is a logic 0, then the voltage at node 176 will toggle dependant on bang/bang inputs 150 and 151. The high and low levels at node 176 are $V_{cc}$ and $V_{cc}-V_{LO}$, with $V_{LO}$ equal to $I_s*(R154+R155)$. When the disable input (160/161) is a logic high, as activated by signal lines 160 and 161, node 176 will have a D.C. value at $V_{cc}-I_s*R154$, or ½(high level+low level). The states of transistors 156 and 157 are set by the disable inputs 160 and 161, which inputs are level shifted by transistors 162 and 163. Together, transistors 156 and 157 act as a current switch. The emitters of transistors 156 and 157 are driven by a current source comprising transistor 165 and resistor 166. Three current sources, each comprised of a transistor and resistor, provide bias current to transistors 162, 163, and 173. Respectively, these current sources are transistor 169 and resistor 170, transistor 167 and resistor 168, and transistor 171 and resistor 172. $V_{cs}$ is applied to each of these current sources, as well as the current source formed by transistor 165 and resistor 166. As in FIG. 2, $V_{cc}$ and $V_{ee}$ are the bang/bang modulation circuit's power supplies.

The delta current $i_{bb}$ is a function of the voltage swing at the emitter output of transistor 173 (node 110), which follows the voltage swing at node 176. When node 176 is in its high state, then $i_{bb}$ will have a negative polarity. When node 176 is in its low state, $i_{bb}$ will be positive. The amplitude of $i_{bb}$ is ½ of the voltage swing at node 176 divided by resistor 105. The dc component through R105 is small compared to $I_o$ and can be ignored.

From FIG. 2, the voltage swing at node 176 is calculated to be $I_s$, defined as $V_{cs}-V_{be}$ of transistor 165, divided by resistor 166, multiplied by the load resistors R154 and R155. Thus, $i_{bb}$ is $0.5 (V_{cs}-V_{be})/166*(R154+R155)$.

From FIG. 3, the D.C. current $I_o$, is defined by the currents of transistors 95 and 96, or $I_o=2(V_{cs}-V_{be})/R103$. The value of R103 is equal to the value of R104. Comparing $i_{bb}$ to $I_o$, and remembering that $V_{be}$ between transistors fabricated on the same die can be made to match very closely, the result is that $i_{bb}/I_o=0.5(V_{cs}-V_{be})/R166*R105)*(R154+R155)$ divided by $2(V_{cs}-V_{be})/R103$, or $i_{bb}/I_o=0.5R103*(R154+R155)$ divided by $2*(R166*R105)=m$. These calculations show that $i_{bb}$ is related to $I_o$ by a factor m defined by a ratio of resistors, which resistors can be fabricated with great precision and repeatability.

In the first preferred embodiment, the bit rate is set to 622.08 MB/sec, which is defined to be OC-12 by Sonet, or STM-4 by SDH standards. The VCO comprises four identical stages. The bang/bang time is set to 0.60 pS/cycle, to conform to the corresponding jitter transfer and jitter corner frequency tolerances. The VCO center operating frequency when $V_{cc}=0$ is 622.08 MHz and the bang/bang frequency is 0.037% of the center frequency or 232 KHz.

The present invention has several advantages over the known art. As the bang/bang frequency is defined by a ratio of resistors and the bit rate, the bang/bang frequency of the VCO is independent of environmental variations. With this compensation, the present invention's dual loop PLL architecture can conform to the jitter tolerance and jitter transfer comer frequency requirements of SONET/SDH.

As the bang/bang frequency is well controlled, the margin of stability for the dual loop PLL architecture is assured despite process and environmental variations. These benefits are not limited to only SONET/SDH applications, but are available at any bit rate.

Compared with previous CDR designs based on 2 path interpolation, the new variable delay cell requires fewer circuit elements and consumes less power. The delay cell taught by the present invention can achieve wider delay variations than the two earlier described known designs, resulting in a wider frequency range for the present invention's VCO.

The disable mode incorporated into the present invention to disable the bang/bang behavior of the VCO, which then reverts to a traditional single input analog controlled VCO, allows the PLL to let the VCO operate undisturbed as long bit streams of ones or zeros are present, preventing the VCO from drifting off.

What is claimed is:

1. A two input voltage controlled oscillator, the first input comprising an analog signal for adjusting the voltage controlled oscillator's output frequency around a predefined center output frequency and the second input comprising a digital signal which switches the voltage controlled oscillator's center output frequency between two bang/bang frequencies, wherein the time difference between the periods of the two bang/bang frequencies, divided by the period defined by the voltage controlled oscillator's operating frequency, is a constant fraction which is independent of the voltage controlled oscillator's supply voltage variations, its operating temperature variations, and its process variations.

2. The two input voltage controlled oscillator of claim 1, the oscillator further comprising:

a plurality of variable delay cells, each delay cell having a first input and a first output, the first output of each variable delay cell coupled to a first input of a succeeding variable delay cell, the plurality of variable delay cells thereby forming a ring, an odd number of variable delay cells having their first output inverted before the first output is coupled to a succeeding variable delay cell, each variable delay cell further comprising an analog signal input for receiving the analog signal and a bang/bang signal input for receiving a bang/bang signal; and a plurality of bang/bang modulators, each bang/bang modulator providing the bang/bang signal to a respective variable delay cell, each bang/bang modulator having a disable signal input for receiving a disable signal and a digital signal input for receiving the first digital signal.

3. The voltage controlled oscillator of claim 2, wherein the total delay of the ring of variable delay cells is determined by a modulation current, the modulation current having a first predetermined direct current component and a second bang/bang current component provided by the bang/bang signal from the bang/bang modulators.

4. The voltage controlled oscillator of claim 3, wherein the ratio of the bang/bang current component and the direct current component of the modulation current is defined by a ratio of resistors in the variable delay cells and the bang/bang modulators.

5. In a voltage controlled oscillator comprised of a plurality of variable delay cells coupled together in a ring configuration, the oscillator having a predetermined center operating frequency and a bang/bang signal input for shifting the center operating frequency up and down by a predefined bang/bang frequency, a method for controlling the bang/bang frequency comprising the steps of:

controlling the delay time through the variable delay cells by means of a modulation current; and generating the modulation current from a combination of a direct current and a bang/bang modulation current, the ratio of the direct current and the bang/bang modulation current being determined by a ratio of resistors.

* * * * *